(12) United States Patent
Saxod et al.

(10) Patent No.: US 10,480,994 B2
(45) Date of Patent: Nov. 19, 2019

(54) ELECTRONIC HOUSING INCLUDING A GROOVED COVER

(71) Applicant: STMicroelectronics (Grenoble 2) SAS, Grenoble (FR)

(72) Inventors: Karine Saxod, Les Marches (FR); Jean-Michel Riviere, Froges (FR)

(73) Assignee: STMicroelectronics (Grenoble 2) SAS, Grenoble (FR)

( * ) Notice: Subject to any disclaimer, the term of this patent is extended or adjusted under 35 U.S.C. 154(b) by 170 days.

(21) Appl. No.: 15/611,266

(22) Filed: Jun. 1, 2017

(65) Prior Publication Data

US 2018/0058920 A1 Mar. 1, 2018

(30) Foreign Application Priority Data

Aug. 26, 2016 (FR) ..................................... 16 57951

(51) Int. Cl.
| | | |
|---|---|---|
| *G01J 1/02* | (2006.01) | |
| *H01L 25/16* | (2006.01) | |
| *G01J 1/04* | (2006.01) | |
| *G01V 8/10* | (2006.01) | |
| *H05K 1/18* | (2006.01) | |
| *H05K 3/28* | (2006.01) | |

(Continued)

(52) U.S. Cl.
CPC .......... *G01J 1/0271* (2013.01); *G01J 1/0403* (2013.01); *G01V 8/10* (2013.01); *H01L 25/167* (2013.01); *H01L 31/0203* (2013.01); *H01L 31/167* (2013.01); *H05K 1/18* (2013.01); *H05K 3/284* (2013.01); *H05K 2201/10151* (2013.01); *H05K 2201/10378* (2013.01)

(58) Field of Classification Search
CPC . G01S 7/4813; H01L 31/0203; H01L 25/167; H01L 33/483; G01J 1/0271
See application file for complete search history.

(56) References Cited

U.S. PATENT DOCUMENTS

| | | | |
|---|---|---|---|
| 2005/0056926 A1* | 3/2005 | Chen .................. | H01L 23/10 257/706 |
| 2005/0168952 A1* | 8/2005 | Chen .................. | H01L 23/04 361/704 |
| 2007/0075236 A1 | 4/2007 | Chen et al. | |

(Continued)

OTHER PUBLICATIONS

INPI Search Report and Written Opinion for FR 1657951 dated Apr. 12, 2017 (8 pages).

(Continued)

*Primary Examiner* — Thanh Luu
(74) *Attorney, Agent, or Firm* — Crowe & Dunlevy

(57) ABSTRACT

A microchip has a rear face attached to a front mounting face of a support plate. An encapsulation cover for the microchip is mounted to the support plate. The encapsulation cover includes a front wall, a peripheral wall extending from the front wall and an inside partition extending from the front wall and between opposite sides of the peripheral wall. The inside partition passes locally above the microchip to delimit two cavities. A bonding material is interposed between encapsulation cover and the support plate and microchip. An end part of the inside partition of the cover, adjacent to the front face of the microchip, include an accumulation and containment recess that is configured to at least partly receive the bonding material.

21 Claims, 4 Drawing Sheets

(51) Int. Cl.
*H01L 31/0203* (2014.01)
*H01L 31/167* (2006.01)

(56) References Cited

U.S. PATENT DOCUMENTS

| | | |
|---|---|---|
| 2011/0204233 A1 | 8/2011 | Costello et al. |
| 2012/0160994 A1 | 6/2012 | Costello et al. |
| 2014/0191253 A1 | 7/2014 | Haslbeck et al. |
| 2014/0319548 A1 | 10/2014 | Luan |
| 2015/0090884 A1* | 4/2015 | Bouchilloux ............ G01S 17/46 250/341.8 |
| 2015/0137148 A1* | 5/2015 | Wong .................... H01L 25/167 257/82 |
| 2015/0226839 A1 | 8/2015 | Brandi et al. |
| 2017/0047455 A1 | 2/2017 | Yiu et al. |

OTHER PUBLICATIONS

U.S. Appl. No. 15/340,216, filed Nov. 1, 2016 (16-TPY-0116US01/851663.643) (28 pages).

* cited by examiner

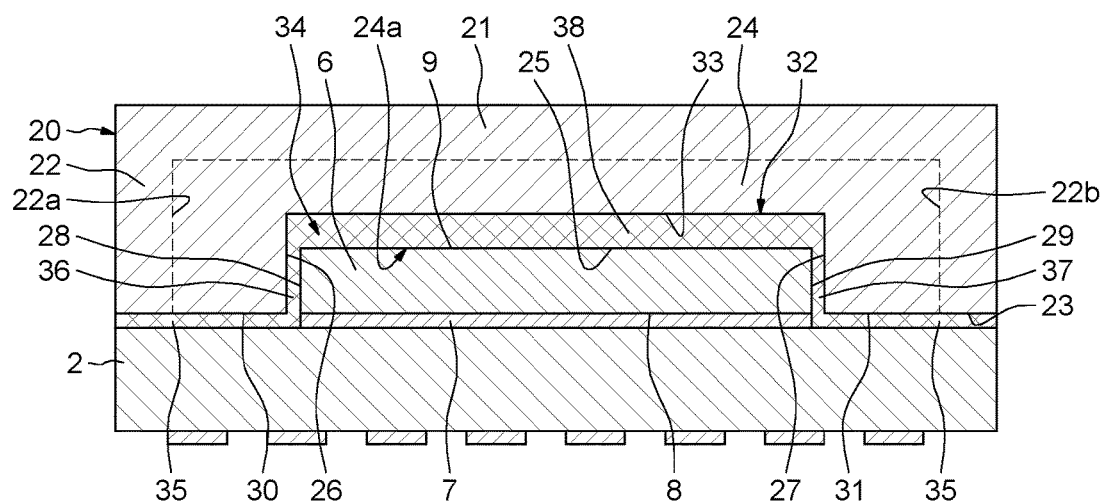
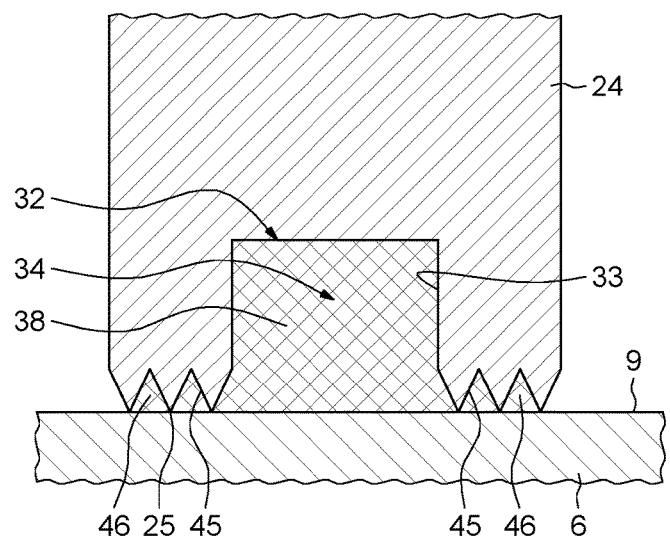

ELECTRONIC HOUSING INCLUDING A GROOVED COVER

PRIORITY CLAIM

This application claims the priority benefit of French Application for Patent No. 1657951, filed on Aug. 26, 2016, the disclosure of which is hereby incorporated by reference in its entirety.

TECHNICAL FIELD

The present invention relates to the field of electronic housings, in particular those that include microchips including light radiation emitters and/or sensors.

BACKGROUND

Electronic housings are known which include a mounting plate on which are mounted a first detector microchip provided with a first and a second light radiation sensor and a second emitter microchip provided with a light radiation emitter and which include an encapsulation cover for the chips.

This cover includes a peripheral wall, a front wall and an inside partition locally passing above the first chip, between its sensors. The partition delimits two cavities so that the emitter of the emitter chip and the first sensor of the receiver chip are located in one of the cavities and the second sensor of the receiver chip is located in the other cavity. The front wall of the cover has an opening facing the emitter of the emitter chip and an opening facing the second sensor of the receiver chip, in which optical elements such as glass plates or optical lenses are placed. Generally, the cover is attached to the mounting plate and to the receiver chip by means of a bonding material. The cover and the bonding material are opaque.

Thus, the light radiation from the emitter chip is emitted towards the outside, the first sensor of the receiver chip captures the light radiation from the emitter chip in the corresponding cavity and the second sensor of the detector chip captures the outside light radiation. A proximity detector may thus be produced in which the signals from the sensors of the receiver chip are processed for detecting the presence or absence of an object in front of the housing. Such a proximity detector may be fitted in a mobile phone, for example, for automatically turning off the screen when the latter is close to a user's ear.

During manufacture, beads of bonding material are spread over the support plate and on the chip and the cover is placed on these beads. Nevertheless, due to the difficulties of calibrating the beads, several drawbacks appear.

There is a risk that the bonding material, interposed between the partition and the receiver chip, creeps by capillarity until it reaches and corrodes the front connecting pads of the chip, and/or until it at least partially covers at least one of the sensors of this chip, so that this sensor is no longer capable of correctly detecting the light radiation. The bonding material may also creep, by capillarity, along the internal walls of the cover, until it reaches the optical elements placed in the openings of the front wall of the cover. In the event of discontinuity in the bonding material, the light radiation present in one of the cavities may penetrate into the other cavity, so that the light radiation detection by the sensors of the receiver chip is distorted. In addition, the strength of the cover attachment, notably of its partition on the receiver chip, is unpredictable.

SUMMARY

According to one embodiment, an electronic housing is provided which includes a support plate with a front mounting face, at least one microchip with a rear face attached to the front mounting face of the support plate and a front face, an encapsulation cover for said chip, including a peripheral wall, a front wall and an inside partition passing locally above said chip and delimiting two cavities, and a bonding material interposed between on the one hand the support plate and the chip and on the other hand the peripheral wall and the cover partition.

At least the end part of the cover partition, adjacent to the front face of the chip, has at least one accumulation and containment recess capable of at least partly receiving the bonding material.

Said cover partition may rest on the front face of the chip.

Said recess may include at least one accumulation and containment groove extending longitudinally to the partition.

The peripheral wall and the inside partition of the cover may have edges which are located at a distance from the front face of the support plate and the flanks of the chip, the bonding material including layers therebetween.

Said accumulation and containment groove may extend at least above the front face of the chip and up to the opposite edges thereof.

Said recess may include at least one main accumulation and containment groove extending longitudinally to the partition and secondary accumulation and containment grooves extending longitudinally to the inside partition and located on each side of the main groove.

The end part of the cover partition, adjacent to the front face of the chip, may include at least one opening extending transversely to the inside partition, forming a vent.

The cover and the bonding material may be opaque.

Said chip may include light radiation sensors located on each side of said partition, in said cavities, the front wall of the cover being able to include an opening facing the sensor located in one of the cavities. Another microchip may be attached to the support plate and may be located in the other cavity, this other chip being able to include a light radiation emitter, the front wall of the cover including another opening facing this emitter.

Elements allowing light to pass may be mounted in said openings in the cover.

BRIEF DESCRIPTION OF THE DRAWINGS

An electronic housing will now be described as an example of embodiment, illustrated by the drawing in which:

FIG. 3 represents a cross-section of the electronic housing in FIG. 1, along III-III;

FIGS. 4 to 7 represent local sections of the electronic housing, showing variant embodiments.

DETAILED DESCRIPTION

Figure 1:
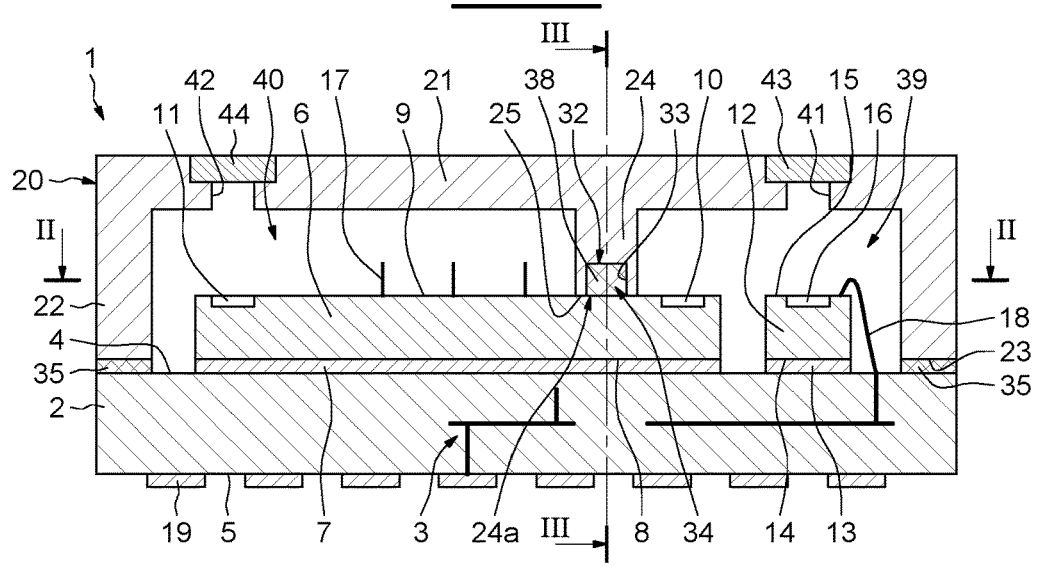
FIG. 1 represents a longitudinal median section of an electronic housing, along I-I in FIG. 2.
Figure 2:
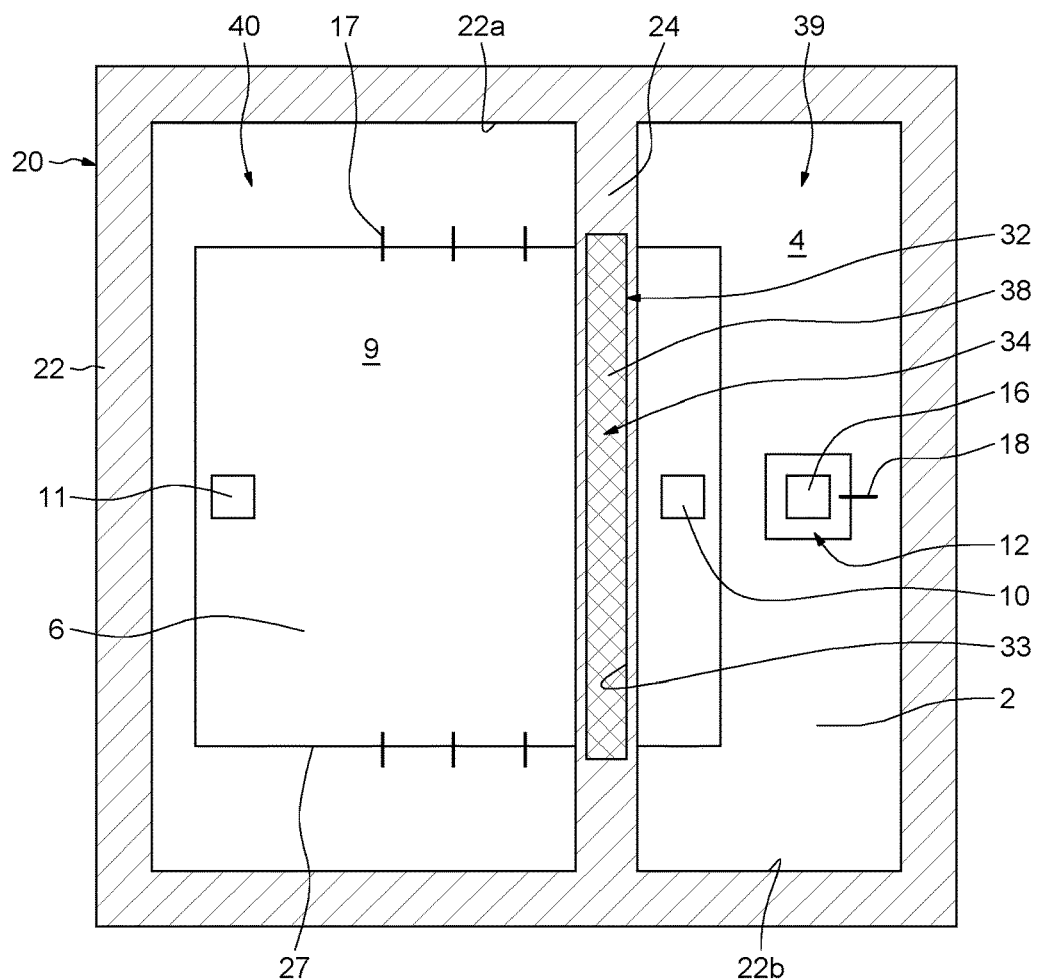
FIG. 2 represents a flat section of the electronic housing in FIG. 1, along II-II.

An electronic housing 1, illustrated in FIGS. 1 to 3, includes an opaque support plate 2 including an integrated electrical connection network 3 with a front mounting face 4 and a rear face 5.

The electronic housing 1 includes a receiver microchip 6 mounted on the front mounting face 4 of the support plate 2 by means of a layer of glue 7 interposed between the front mounting face 4 and a rear face 8 of the receiver chip 6. In its front face 9, the receiver chip 6 is provided with two light radiation sensors 10 and 11 which are at a distance from each other.

The electronic housing 1 includes an emitter microchip 12 mounted on the front mounting face 4 of the support plate 2 by means of a layer of glue 13 interposed between the front mounting face 4 and a rear face 14 of the emitter chip 12. In its front face 15, the emitter chip 12 is provided with a light radiation emitter 16.

The chips 6 and 12 are located at a distance from the peripheral edge of the support plate 2 and at a distance from each other and are placed so that the sensors 10 and 11 and the emitter 16 are aligned in a longitudinal median direction.

The chips 6 and 12 are electrically connected to the electrical connection network 3 thanks respectively to electrical connection wires 17 and 18 which respectively connect front pads of the support plate 2, connected to the electrical connection network 3, and front pads of the chips 6 and 12. The front pads of the support plate 2 are located at a distance from the peripheral edge of this support plate 2.

The rear face 5 of the support plate 2 is provided with outside electrical connection pads 19, connected to the electrical connection network 3, with a view to electrically connecting, via the electrical connection network 3, the chips 6 and 12 to an outside component, e.g. a printed circuit board.

The electronic housing 1 further includes an opaque encapsulation cover 20 for the microchips 6 and 12. This cover 20 may be made of a plastic material such as a thermosetting resin.

The encapsulation cover 20 is bowl-shaped and includes a front wall 21 which is arranged parallel to the support plate 2, at a distance above the chips 6 and 12 and the electrical wires 17 and 18, and a peripheral wall 22 which projects towards the rear with respect to the front wall 21 and which extends laterally to the periphery and at a distance from the chips 6 and 12 and the electrical wires 17 and 18. The peripheral wall 22 has a rear end edge 23 adjacent to a peripheral area of the front face 4 of the support plate 2.

The encapsulation cover 20 further includes an inside transverse partition 24 which projects in an extension from the front wall 21 and from two internal opposite flanks 22a and 22b of the peripheral wall 22, forming a bridge arranging a passage 24a traversed by the receiver chip 6 and which passes locally above the receiver chip 6, between and at a distance from the sensors 10 and 11.

Thus, the inside partition 24 has a rear end edge 25 adjacent to the front face 9 of the receiver chip 6, opposite lateral edges 26 and 27 adjacent to corresponding opposite flanks 28 and 29 of the receiver chip 6 and rear end edges 30 and 31 adjacent to the front face 4 of the support plate 2, on each side of the receiver chip 6. The opposite lateral edges 26 and 27 constitute the flanks of the passage 24a and the rear end edge 25, which meets the opposite lateral edges 26 and 27, constitutes the bottom of the passage 24a.

The rear end edge of the peripheral wall 22 is attached to a peripheral area of the front face 4 of the support plate 2 by means of a layer of glue 23.

Optionally, the rear end edge 25 rests on the front face 9 of the receiver chip 6. The opposite lateral edges 26 and 27 are at a distance from the corresponding opposite flanks 28 and 29 of the receiver chip 6. The rear end edges 30 and 31 and the rear edge 23 of the peripheral wall 22 are at a distance from the front face 4 of the support plate 2 and extend in the same plane parallel to the front face 4 of the support plate 2.

The rear end portion of the inside partition 24, including the rear end edge 25, is provided with an accumulation and containment recess 32 open on the side of the front face 9 of the receiver chip 6.

According to a variant embodiment, this recess includes an accumulation and containment groove 33 which extends longitudinally to the partition 24, at least on one portion located between the sensors 10 and 11. According to the example represented, the accumulation and containment groove 33 extends from one side to the other of the receiver chip 6, possibly up to the opposite lateral edges 26 and 27 and is, for example, rectangular in section.

The encapsulation cover 20 is attached by means of an opaque bonding material 34 interposed between on the one hand the support plate 2 and the receiver chip 6 and on the other hand the peripheral wall 22 and the inside partition 24 of the cover 20.

Thus, the bonding material 34 includes a layer of glue 35 interposed between on the one hand the rear edge 23 of the peripheral wall 22 and the rear end edges 30 and 31 of the inside partition 24 and on the other hand the front face 4 of the support plate 2, layers of glue 36 and 37 interposed between the opposite lateral edges 26 and 27 of the inside partition 24 and the corresponding opposite flanks 28 and 29 of the receiver chip 6 and a bead of glue 38 which at least partially fills the accumulation and containment groove 33 and which is interposed between this groove 33 and the front face 9 of the receiver chip 6.

Optionally, a layer of bonding material 34 could be interposed between the rear edge 25 of the inside partition 24 and the front face of the receiver chip 6, e.g. for filling in the surface defects of the chip and the partition.

The result is that the encapsulation cover 20 delimits, in front of the front face 4 of the support plate 2, two cavities 39 and 40 located on each side of the inside partition 24, inside which are respectively located on the one hand the sensor 10 of the receiver chip 6 and the emitter 16 of the emitter chip 12 and on the other hand the sensor 11 of the receiver chip 6.

The layer 35, the layers 36 and 37 and the bead 38 are continuous and are in extension of one another, so that there is no gap that could allow light to pass from one of the cavities 39 and 40 into the other.

The front wall 21 of the cover 20 has openings 41 and 42 respectively located in front of the emitter 16 and the sensor 11. In these openings 41 and 42, the front wall 21 of the cover 20 is provided with optical shutter elements 43 and 44 allowing light to pass, e.g. in the form of pellets or lenses.

According to one mode of operation, the emitter 16 of the emitter chip 12 emits light radiation towards the outside through the optical element 43. This light radiation present in the cavity 39 is captured by the sensor 10 of the receiver chip 6. The sensor 11 of the receiver chip 6 captures the outside light radiation through the optical element 44.

The signals from the sensors 10 and 11 are processed by the receiver chip 4 and/or an outside electronic component for detecting the presence or absence of an object in front of the cover 20 and producing a command.

The electronic housing 1 may be manufactured in the following way.

The microchips 6 and 12 being mounted on the support plate 2 and the electrical wires being put into place, beads of bonding material 34 are spread, e.g. in a liquid or paste-like resin, on the front face 4 of the support plate 2 and on the front face 9 and the flanks 28 and 29 of the chip 6, in accordance with the desired quantities.

Then, the encapsulation cover 20 is placed on these spread beads, which is compressed until the rear end edge 25 of the inside partition 24 rests on the front face of the receiver chip 6.

During this operation of compressing the encapsulation cover 20, the bead of bonding material 34 spread on the front face 9 of the chip 6 at least partially penetrates into the accumulation and containment groove 33 of the inside partition 24, preferably without creeping beyond the sides of this partition 24 towards the sensors 10 and 11.

The hardening of the bonding material causes the encapsulation cover 20 to be attached. The layer 35, the layers 36 and 37 and the bead 38 are formed.

The optical elements 43 and 44 may be mounted on the encapsulation cover 20 before or after the assembly operation described above.

Thanks to the existence of the accumulation and containment groove 33, the quantity of bonding material 34 interposed between the inside partition 24 and the front face 9 of the receiver chip 6 may be increased, so as to constitute a continuous and light-tight bead 38, without the bonding material 34 reaching the sensors 10 and 11 during the mounting operation and while ensuring correct assembly. For this, the quantity of bonding material 34 interposed between the inside partition 24 and the front face 9 of the receiver chip 6 will be adjusted so that the section of the bead 38 is less than or close to the section of the accumulation and containment groove 33.

It is also possible, before mounting the encapsulation cover 20, to spread liquid or paste-like beads of bonding material 34 with substantially constant sections, thanks to a machine, the operation of which is thus facilitated.

According to a variant embodiment illustrated in FIG. 4, the recess 32 arranged in the end portion of the partition 24 adjacent to the front face 9 of the receiver chip 6 further includes a plurality of secondary accumulation and containment grooves 45 parallel to the accumulation and containment groove 33 and located on each side thereof, the grooves 45, being, for example, less deep than the accumulation and containment groove 33. As represented, the secondary accumulation and containment grooves 45 are triangular in section.

During the placing of the encapsulation cover 20 as previously described, the bonding material 34 also, at least partially, fills the secondary accumulation and containment grooves 45, forming secondary beads 46 also contiguous with the front face 9 of the receiver chip 6.

Figure 5:
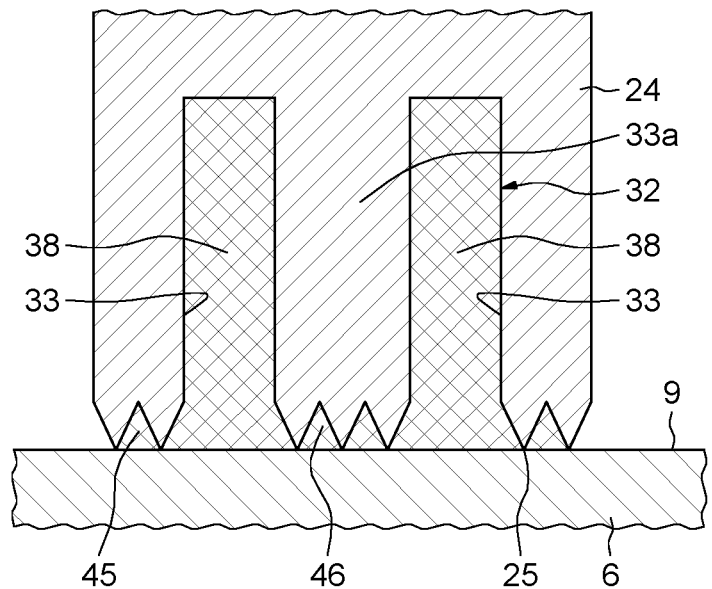

According to a variant embodiment illustrated in FIG. 5, the recess 32 arranged in the end portion of the partition 24 adjacent to the front face 9 of the receiver chip 6 includes two parallel grooves 33, separated by a rib 33a, capable of forming parallel beads 38 and a plurality of secondary grooves 45 equivalent to those of the example described with reference to FIG. 4 and further arranged in the end of the rib 33a, capable of forming secondary parallel beads 46.

Figure 6:
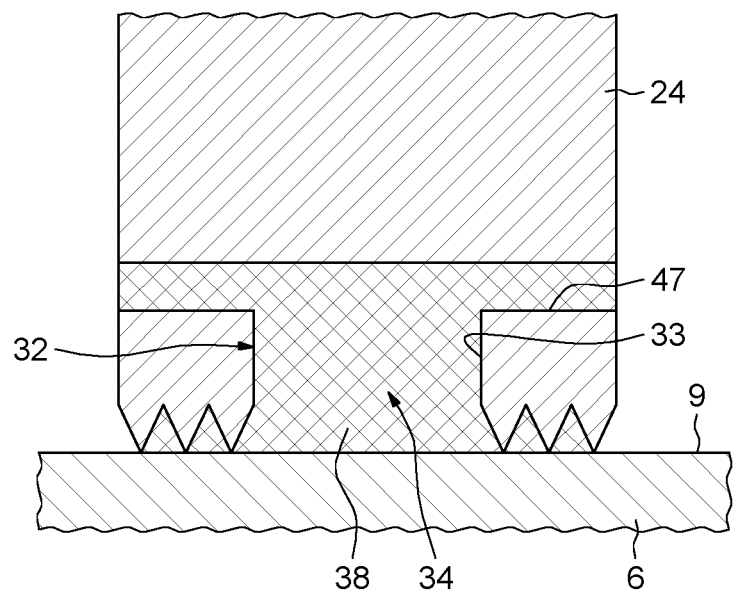

According to a variant embodiment illustrated in FIG. 6, the end portion of the partition 24 adjacent to the front face 9 of the receiver chip 6 is provided with spaced orifices 47 traversing its flanks delimiting the accumulation and containment groove 33, these orifices 47, of small section, constituting vents facilitating the penetration of the bonding material 34 into the groove 33 during the operation of assembling the encapsulation cover 20 previously described.

Figure 7:
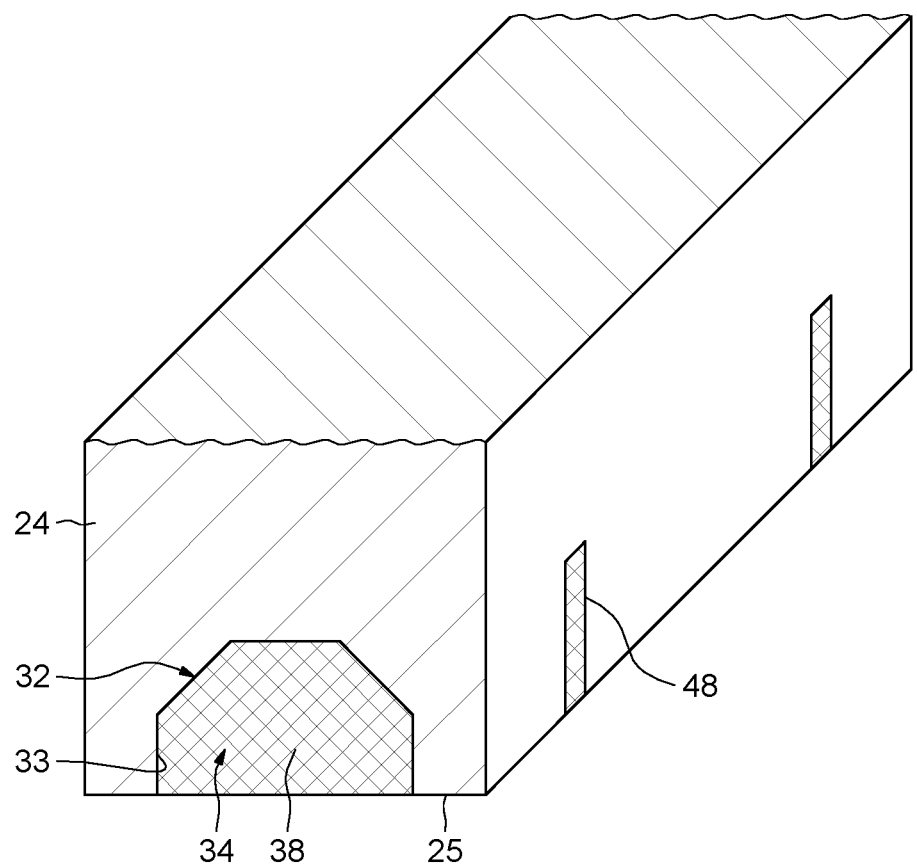

According to a variant embodiment illustrated in FIG. 7, the end portion of the partition 24 adjacent to the front face 9 of the receiver chip 6 is provided with thin, spaced slits 48 traversing its flanks delimiting the accumulation and containment groove 33, these slits 48 also opening onto the front face 9 of the receiver chip 6. These slits 48 also constitute vents facilitating the penetration of the bonding material 34 into the groove 33 during the operation of assembling the encapsulation cover 20 previously described.

In all the variant embodiments illustrated in FIGS. 1 to 7, the bonding material 34 is represented as completely filling the accumulation and containment grooves 33. As explained earlier in relation to FIGS. 1 to 3, the bonding material 34 may only partially fill these grooves.

The accumulation and containment groove 33 may be of any section, e.g. rectangular section as illustrated in FIGS. 1 to 6, or triangular or polygonal section with, for example, five facets as illustrated in FIG. 7.

The encapsulation cover 20 may consist of a single part or several parts. For example, the front wall 21, provided with the inside partition 24, may be added using an opaque bonding onto the front end of the peripheral wall 22.

The invention claimed is:

1. An apparatus, comprising:
   a support plate having a front mounting face;
   at least one microchip having a rear face attached to the front mounting face of the support plate and having a front face;
   an encapsulation cover for said at least one microchip, the encapsulation cover including a peripheral wall, a front wall and an inside partition passing locally above said at least one microchip and delimiting two cavities; and
   a bonding material interposed between the support plate and the peripheral wall so as to attach the peripheral wall to the support plate and further interposed between the at least one microchip and the inside partition of the cover so as to attach the inside partition to the front face of the at least one microchip;
   wherein at least an end part of the inside partition of the encapsulation cover adjacent to the front face of the at least one microchip includes at least one accumulation and containment recess configured to at least partly receive the bonding material; and
   wherein said at least one microchip includes light radiation sensors located on opposite sides of said inside partition, wherein the front wall of the encapsulation cover includes a first opening facing a sensor located in one of the two cavities, and wherein another of the two cavities includes another microchip attached to the support plate, this another microchip including a light radiation emitter, and wherein the front wall of the encapsulation cover further includes a second opening facing the light radiation emitter.

2. The apparatus according to claim 1, wherein at least a portion of said inside partition of the encapsulation cover is attached by the bonding material to the front face of the at least one microchip.

3. The apparatus according to claim 1, wherein said at least one accumulation and containment recess comprises a groove extending longitudinally along a bottom surface of the inside partition.

4. The apparatus according to claim 3, wherein said groove extends at least above the front face of the at least one microchip and between opposite edges of the at least one microchip.

5. The apparatus according to claim 1, wherein the peripheral wall and the inside partition of the encapsulation cover have edges which are located at a distance from the front face of the support plate and flanks of the at least one microchip, and wherein the bonding material includes layers between the peripheral wall and the front face and between the inside partition and the flanks of the at least one microchip.

6. The apparatus according to claim 1, wherein said at least one accumulation and containment recess includes at least one main groove extending longitudinally along a bottom surface of the inside partition and further includes secondary grooves extending longitudinally along the bottom surface of the inside partition parallel to and located on opposite sides of the at least one main groove.

7. The apparatus according to claim 6, wherein a depth of the main groove is greater than a depth of the secondary grooves.

8. The apparatus according to claim 1, wherein the end part of the inside partition, adjacent to the front face of the at least one microchip, includes at least one opening extending transversely to the inside partition to form a vent.

9. The apparatus according to claim 1, wherein the cover and the bonding material are opaque.

10. The apparatus according to claim 1, further including light transmissive elements mounted in said first and second openings.

11. An apparatus, comprising:
a support plate having a front mounting face;
a microchip having a rear face attached to the front mounting face of the support plate and a front face including a first optical sensor and a second optical sensor;
an encapsulation cover including a front wall, a peripheral wall projecting from the front wall and an inside partition projecting from the front wall and extending between opposite sides of said peripheral wall;
wherein the peripheral wall is mounted by an adhesive to the front mounting face;
wherein the inside partition is mounted by an adhesive to a front face of the microchip in a position that extends between the first and second optical sensors; and
wherein a bottom edge of the inside partition adjacent to the front face of the microchip includes at least one accumulation and containment recess configured to at least partly receive the adhesive material and constrain the received adhesive material from creeping towards either of the first and second optical sensors; and
wherein said first and second optical sensors of said microchip are located on opposite sides of said inside partition, wherein the front wall of the encapsulation cover includes a first opening facing the first optical sensor located in one of the two cavities, and wherein another of the two cavities includes another microchip attached to the support plate, this another microchip including a light radiation emitter, and wherein the front wall of the encapsulation cover further includes a second opening facing the light radiation emitter.

12. The apparatus of claim 11, wherein the least one accumulation and containment recess comprises:
at least one main groove extending longitudinally along the bottom edge of the inside partition; and
secondary grooves extending longitudinally along the bottom edge of the inside partition parallel to and located on opposite sides of the at least one main groove.

13. The apparatus of claim 12, wherein a depth of the at least one main groove is greater than a depth of the secondary grooves.

14. The apparatus of claim 11, wherein the least one accumulation and containment recess comprises:
a first main groove extending longitudinally along the bottom edge of the inside partition;
a second main groove extending longitudinally along the bottom edge of the inside partition parallel to the first main groove; and
a first secondary groove extending longitudinally along the bottom edge of the inside partition parallel to and located between the first and second main grooves.

15. The apparatus of claim 14, wherein a depth of the first and second main grooves is greater than a depth of the secondary groove.

16. The apparatus of claim 11, wherein said inside partition includes opposed side walls extending between the bottom edge of the inside partition and the front wall, and further including a vent in communication with the at least one accumulation and containment recess and extending between the opposed side walls.

17. The apparatus of claim 11, further including light transmissive elements mounted in said first and second openings.

18. An apparatus, comprising:
a support plate having a front mounting face;
a microchip having a rear face attached to the front mounting face of the support plate and a front face;
an encapsulation cover including a front wall, a peripheral wall projecting from the front wall and an inside partition projecting from the front wall and extending between opposite sides of said peripheral wall;
wherein the peripheral wall is mounted by an adhesive to the front mounting face;
wherein the inside partition is mounted by an adhesive to a front face of the microchip; and
wherein a bottom edge of the inside partition adjacent to the front face of the microchip includes at least one accumulation and containment recess configured to at least partly receive the adhesive material, said at least one accumulation and containment recess comprising:
at least one main groove extending longitudinally along the bottom edge of the inside partition; and
secondary grooves extending longitudinally along the bottom edge of the inside partition parallel to and located on opposite sides of the at least one main groove;
wherein a depth of the at least one main groove is greater than a depth of the secondary grooves.

19. The apparatus of claim 18, wherein said inside partition includes opposed side walls extending between the bottom edge of the inside partition and the front wall, and further including a vent in communication with the at least one accumulation and containment recess and extending between the opposed side walls.

20. An apparatus, comprising:
a support plate having a front mounting face;
a microchip having a rear face attached to the front mounting face of the support plate and a front face;
an encapsulation cover including a front wall, a peripheral wall projecting from the front wall and an inside partition projecting from the front wall and extending between opposite sides of said peripheral wall;
wherein the peripheral wall is mounted by an adhesive to the front mounting face;
wherein the inside partition is mounted by an adhesive to a front face of the microchip; and
wherein a bottom edge of the inside partition adjacent to the front face of the microchip includes at least one accumulation and containment recess configured to at least partly receive the adhesive material, said at least one accumulation and containment recess comprising:
- a first main groove extending longitudinally along the bottom edge of the inside partition;
- a second main groove extending longitudinally along the bottom edge of the inside partition parallel to the first main groove; and
- a first secondary groove extending longitudinally along the bottom edge of the inside partition parallel to and located between the first and second main grooves;
- wherein a depth of the first and second main grooves is greater than a depth of the secondary groove.

21. The apparatus of claim 20, wherein said inside partition includes opposed side walls extending between the bottom edge of the inside partition and the front wall, and further including a vent in communication with the at least one accumulation and containment recess and extending between the opposed side walls.

* * * * *